(12) United States Patent
Lin et al.

(10) Patent No.: US 11,916,084 B2
(45) Date of Patent: Feb. 27, 2024

(54) TRANSPARENT DISPLAY PANEL

(71) Applicant: AUO Corporation, Hsinchu (TW)

(72) Inventors: Chun-Yu Lin, Hsinchu (TW);
Kun-Cheng Tien, Hsinchu (TW);
Jia-Long Wu, Hsinchu (TW);
Ming-Lung Chen, Hsinchu (TW);
Shu-Hao Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 17/895,009

(22) Filed: Aug. 24, 2022

(65) Prior Publication Data
US 2023/0113781 A1 Apr. 13, 2023

(30) Foreign Application Priority Data

Oct. 13, 2021 (TW) .................................. 110138048

(51) Int. Cl.
| | | |
|---|---|---|
| *G02F 1/1343* | (2006.01) | |
| *H01L 27/12* | (2006.01) | |
| *G02F 1/1362* | (2006.01) | |
| *H10K 59/131* | (2023.01) | |
| *H10K 59/35* | (2023.01) | |
| *H01L 25/16* | (2023.01) | |

(52) U.S. Cl.
CPC ...... *H01L 27/124* (2013.01); *G02F 1/134336* (2013.01); *G02F 1/136286* (2013.01); *G02F 1/136209* (2013.01); *G02F 2203/01* (2013.01); *H01L 25/167* (2013.01); *H10K 59/131* (2023.02); *H10K 59/352* (2023.02)

(58) Field of Classification Search
CPC ...................................................... G02F 1/1362
See application file for complete search history.

(56) References Cited

U.S. PATENT DOCUMENTS 6,175,394 B1 * 1/2001 Wu ................... G02F 1/136204
349/40
8,558,222 B2 10/2013 Hwang et al.
(Continued)

FOREIGN PATENT DOCUMENTS

| CN | 102130148 | | 7/2013 | |
|---|---|---|---|---|
| CN | 108447873 | * | 8/2018 | ............. H01L 21/77 |
| TW | I724488 | | 4/2021 | |

*Primary Examiner* — Sang V Nguyen
(74) *Attorney, Agent, or Firm* — JCIPRNET

(57) ABSTRACT

A transparent display panel with driving electrode regions, circuit wiring regions, and optically transparent regions is provided. The driving electrode regions are arranged into an array in a first direction and a second direction. An average light transmittance of the circuit wiring regions is less than ten percent, and an average light transmittance of the optically transparent regions is greater than that of the driving electrode regions and the circuit wiring regions. The first direction intersects the second direction. The circuit wiring regions connect the driving electrode regions at intervals, such that each optically transparent region spans among part of the driving electrode regions. The transparent display panel includes first signal lines and second signal lines extending along the circuit wiring regions, and each circuit wiring region is provided with at least one of the first signal lines and at least one of the second signal lines.

17 Claims, 11 Drawing Sheets

(56) References Cited

U.S. PATENT DOCUMENTS

| | | | |
|---|---|---|---|
| 2011/0147770 A1* | 6/2011 | Hwang | H10K 59/121 |
| | | | 257/89 |
| 2012/0307172 A1* | 12/2012 | Yoshida | G02F 1/136227 |
| | | | 349/110 |
| 2021/0082964 A1* | 3/2021 | Lee | G02F 1/136286 |
| 2021/0175788 A1* | 6/2021 | Suzuki | H02K 41/031 |

* cited by examiner

TRANSPARENT DISPLAY PANEL

CROSS-REFERENCE TO RELATED APPLICATION

This application claims the priority benefit of Taiwan application serial no. 110138048, filed on Oct. 13, 2021. The entirety of the above-mentioned patent application is hereby incorporated by reference herein and made a part of this specification.

BACKGROUND

Technical Field

The disclosure relates to a display panel, and in particular, relates to a transparent display panel.

Description of Related Art

Transparent display panels are display panels with a certain degree of transparency. A user may see the image information displayed on a transparent display panel and may also see the background information behind the transparent display panel. Transparent display panels are suitable for use in vending machines, car windows, shop windows and the like. Transparent display panels generally employ liquid crystal display panel (LED), organic light-emitting diode (OLED), or micro light-emitting diode (µLED) technology.

In order to allow a user to receive the display information and the physical information of the background together, a transparent display panel includes element arrangement regions with a low average light transmittance and penetrating regions with a high average light transmittance. The element arrangement regions may be used for arranging the driving electrodes or the self-luminous diodes (e.g., organic light-emitting diodes or micro light-emitting diodes) of the liquid crystal display and related circuit wires, and the penetrating regions allow the user to receive the background behind the transparent display panel. Since the circuit wires may divide each penetrating region into a plurality of small penetrating areas, this may lead to the generation of diffraction, and the image quality may thus be lowered. Therefore, how to reduce the diffraction in the transparent display panel and make the transparent display panel maintain a certain degree of transparency is a problem needs to be urgently solved at present.

SUMMARY

The disclosure provides a transparent display panel capable of reducing the diffraction in the transparent display panel and allowing the transparent display panel to maintain a certain degree of transparency.

An embodiment of the disclosure provides a transparent display panel having a plurality of driving electrode regions, a plurality of circuit wiring regions, and a plurality of optically transparent regions. The driving electrode regions are arranged into an array in a first direction and a second direction. An average light transmittance of the circuit wiring regions is less than ten percent, and an average light transmittance of the optically transparent regions is greater than that of the driving electrode regions and the circuit wiring regions. The first direction intersects the second direction. The circuit wiring regions connect the driving electrode regions at intervals, such that each of the optically transparent regions spans among part of the driving electrode regions. The transparent display panel includes a plurality of first signal lines and a plurality of second signal lines extending along the circuit wiring regions, and each of the circuit wiring regions includes at least one of the first signal lines and at least one of the second signal lines.

In an embodiment of the disclosure, the driving electrode regions are equally spaced to define a plurality of pixel units, and an area of each of the optically transparent regions is one to three times an area of each of the pixel units.

In an embodiment of the disclosure, according to different extending directions, the circuit wiring regions may be divided into first circuit wiring regions and second circuit wiring regions. The first circuit wiring regions connect every three driving electrode regions at intervals in the first direction to form a plurality of first direction strings, and the adjacent first direction strings in the first direction are spaced apart from each other. The second circuit wiring regions connect every three driving electrode regions at intervals in the second direction to form a plurality of second direction strings, and the adjacent second direction strings in the second direction are spaced apart from each other.

In an embodiment of the disclosure, the optically transparent regions of the transparent display panel span among the adjacent first direction strings and span among the adjacent second direction strings.

In an embodiment of the disclosure, the middle driving electrode region among the three driving electrode regions in each first direction string is the edge driving electrode region among the three driving electrode regions in each second direction string.

In an embodiment of the disclosure, the middle driving electrode region among the three driving electrode regions in each second direction string is the edge driving electrode region among the three driving electrode regions in each first direction string.

In an embodiment of the disclosure, an extending direction of the first circuit wiring regions is not parallel to the first direction.

In an embodiment of the disclosure, an extending direction of the second circuit wiring regions is not parallel to the second direction.

In an embodiment of the disclosure, each of the first signal lines includes a plurality of series-connected segments and a plurality of meandering segments. Each of the series-connected segments extends along the corresponding first direction string. The meandering segments are connected between the series-connected segments and meander between the corresponding first direction strings and the adjacent first direction strings.

In an embodiment of the disclosure, each of the meandering segments includes two first sub-segments and one second sub-segment. The two first sub-segments extend from the corresponding first direction strings to the adjacent first direction strings along the corresponding second direction strings. The second sub-segment extends along the adjacent first direction string and is connected between the two first sub-segments.

In an embodiment of the disclosure, each of the second signal lines includes a plurality of series-connected segments and a plurality of meandering segments. Each of the series-connected segments extends along the corresponding second direction string. The meandering segments are connected between the series-connected segments and meander between the corresponding second direction strings and the adjacent second direction strings.

In an embodiment of the disclosure, each of the meandering segments includes two first sub-segments and one second sub-segment. The two first sub-segments extend from the corresponding second direction strings to the adjacent second direction strings along the corresponding first direction strings. The second sub-segment extends along the adjacent second direction string and is connected between the two first sub-segments.

In an embodiment of the disclosure, the transparent display panel further includes a light-shielding layer completely covering the circuit wiring regions.

In an embodiment of the disclosure, the light-shielding layer has arc-shaped contours at intersections of the circuit wiring regions and the driving electrode regions.

In an embodiment of the disclosure, the first signal lines and the second signal lines are formed by at least two conductive layers, and the first signal lines and the second signal lines are electrically independent from each other.

To sum up, in the transparent display panel provided by the disclosure, since the intervals among some of the circuit wiring regions are inconsistent, the optical diffraction caused by the dense distribution of the circuit wiring regions may be suppressed. The widely spaced circuit wiring regions increase the width of each optically transparent region, so that the transparent display panel is allowed to exhibit a certain degree of light transmittance. Further, in the transparent display panel provided by the disclosure, arc-shaped contours may be provided at the intersections of the circuit wiring regions and the driving electrode regions, interference of image light due to optical diffraction at the edges of the contours is reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
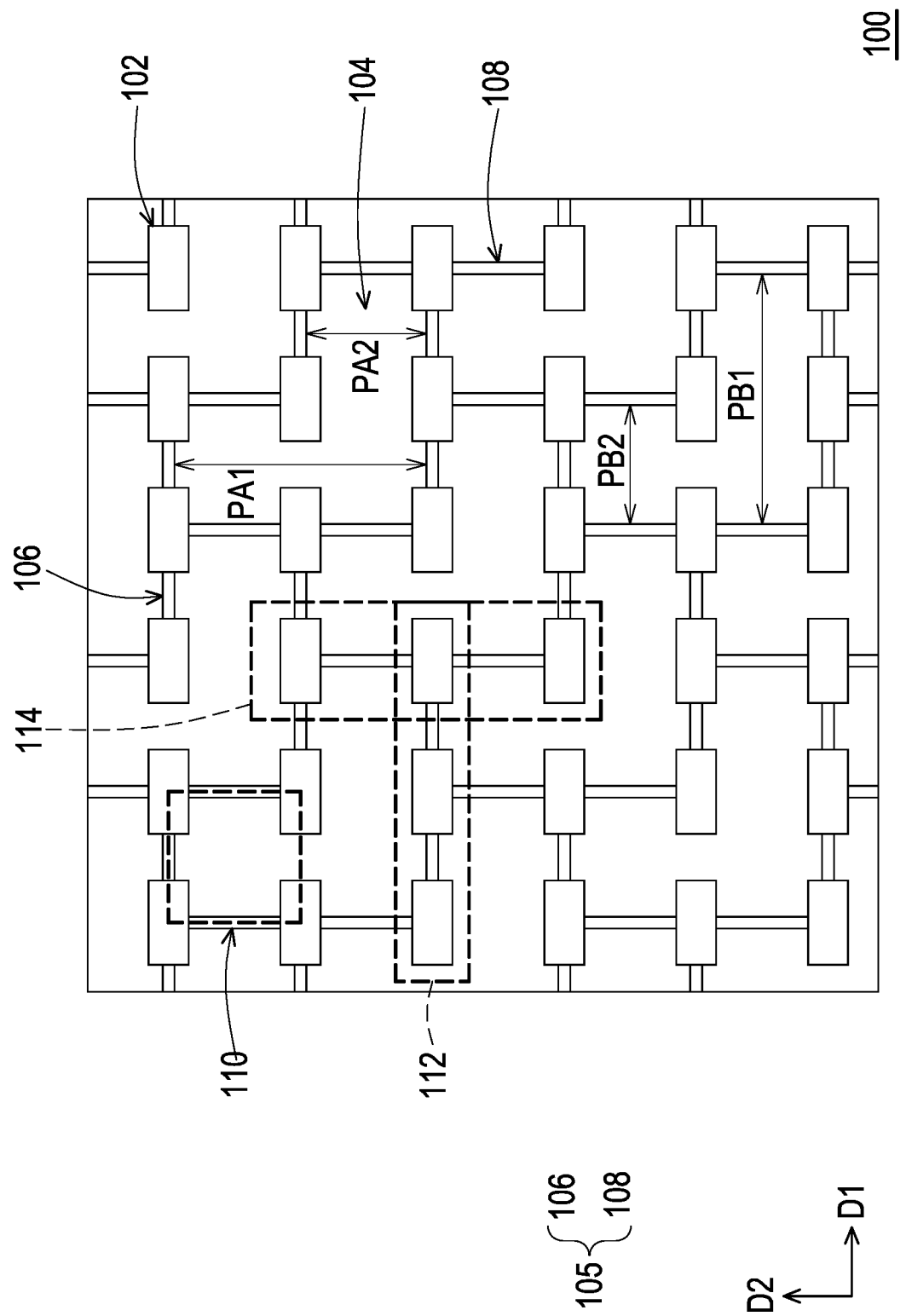
FIG. 1 is a top view of a transparent display panel according to an embodiment of the disclosure.

The disclosure is more comprehensively described with reference to the figures of the present embodiments. However, the disclosure can also be implemented in various different forms, and is not limited to the embodiments in the present specification. The same or similar reference numerals represent the same or similar devices and are not repeated in the following paragraphs.

The terms used herein such as "about", "approximate", or "substantial" include a related value and an average within an acceptable deviation range of specific values determined by those with ordinary skills in the art with consideration of discussed measurement and a specific number of errors related to the measurement (i.e., a limitation of a measurement system). For example, "about" may mean within one or more standard deviations, or within, for example, ±30%, ±20%, ±15%, ±10%, and ±5% of the stated value. Further, acceptable tolerance ranges or standard deviations may be selected for the "about", "approximate", or "substantial" used herein based on optical properties, etching properties, or other properties.

Unless otherwise defined, all terms (including technical and scientific terms) used herein have the same meaning as commonly understood by a person having ordinary skill in the art. Terms such as those defined in commonly used dictionaries should be interpreted as having a meaning that is consistent with their meaning in the context of the related art, and these terms are not to be construed in an idealized or excessively formal sense unless explicitly defined as such herein.

In the related art, the circuit wires of a transparent display panel are laid out in a crisscross manner, which causes the light to be diffracted when passing through the gaps between the circuit wires, so that the image of the transparent display panel is blurred. In order to improve the image quality and maintain a certain degree of transparency of a transparent display panel, in the disclosure, by means of wire concentration and staggered arrangement of wires, the diffraction caused by the wires may be reduced and a sufficient penetrating region is maintained.

FIG. 1 is a top view of a transparent display panel 100 according to an embodiment of the disclosure. With reference to FIG. 1, the transparent display panel 100 includes a plurality of driving electrode regions 102, a plurality of optically transparent regions 104, and a plurality of circuit wiring regions 105. The driving electrode regions 102, the optically transparent regions 104, and the circuit wiring regions 105 define a plurality of first direction strings 112, a plurality of second direction strings 114, and a plurality of pixel units 110 on a flat surface of the transparent display panel 100. Each of the first direction strings 112 extends in a first direction (row direction) D1, and each of the second direction strings 114 extends in a second direction D2. The first direction D1 and the second direction D2 intersects. In some embodiments, the first direction D1 and the second direction D2 may be perpendicular to each other, but the disclosure is not limited thereto.

The driving electrode regions 102 are configured to be provided with elements exhibiting a display function, such as organic light-emitting diodes, micro light-emitting diodes, or liquid crystal driving elements. In FIG. 1, the driving electrode regions 102 are rectangular in shape, and it should be understood that the shape of the driving electrode regions 102 is not limited thereto, and driving electrode regions 102 featuring other geometric shapes may also be used depending on the different transparent display panels. In some embodiments, the driving electrode regions 102 may have any geometric shape with geometric center points, and a fixed distance is kept between the geometric center points of adjacent driving electrode regions 102. In some embodiments, the driving electrode regions 102 may be a periodic array arranged in the first direction D1 and the second direction D2.

The circuit wiring regions 105 are regions of low average light transmittance extending among the driving electrode regions 102, for example, the average light transmittance of the circuit wiring regions 105 is less than ten percent. In FIG. 1, the circuit wiring regions 105 are strip-shaped regions, and the circuit wiring regions 105 may be divided into first circuit wiring region 106 and second circuit wiring regions 108 according to different extending directions. The extending directions of the first circuit wiring regions 106 and the second circuit wiring regions 108 are respectively parallel to the first direction D1 and the second direction D2, however, it should be understood that FIG. 1 is merely an example and is not a limitation. In other embodiments, the extending directions of the first circuit wiring regions 106 and the second circuit wiring regions 108 are may not be parallel to the first direction D1 and the second direction D2.

In this embodiment, the first circuit wiring regions 106 connect every three driving electrode regions 102 at intervals in the first direction D1 to define the first direction strings 112, and adjacent first direction strings 112 in the first direction D1 are spaced apart from each other. In other words, no circuit wiring region 105 is provided between any two adjacent first direction strings 112 in the first direction D1. Similarly, the second circuit wiring regions 108 connect every three driving electrode regions 102 at intervals in the second direction D2 to define the second direction strings 114, and adjacent second direction strings 112 in the second direction D2 are spaced apart from each other. That is, no second circuit wiring region 108 is provided between two adjacent second direction strings 114 in the second direction D2.

The middle driving electrode region 102 among the three driving electrode regions 102 in each first direction string 112 is the edge driving electrode region 102 among the three driving electrode regions 102 in one of the second direction strings 114. The middle driving electrode region 102 among the three driving electrode regions 102 in each second direction string 114 is the edge driving electrode region 102 among the three driving electrode regions 102 in one of the first direction strings 112. Therefore, any one of the first direction strings 112 and one of the corresponding second direction strings 114 may form a T-shaped pattern, but it is not limited thereto.

As shown in FIG. 1, the driving electrode regions 102 are distributed at equal intervals. Therefore, according to the arrangement of the driving electrode regions 102, the pixel units 110 may be defined in the transparent display panel 100. For instance, the range of the pixel unit 110 shown in FIG. 1 is an imaginary region defined by lines connecting the geometric center points of the driving electrode regions 102 to the geometric center points of the adjacent driving electrode regions 102, and this region is not a real element. In other embodiments, the pixel unit 10 may be defined as an imaginary region defined by lines connecting specified corners (e.g., the upper left corner of the drawing) of the driving electrode regions 102 to specified corners (e.g., the upper left corner of the drawing) of the adjacent driving electrode regions 102.

The regions outside the driving electrode regions 102 and the circuit wiring regions 105 are the optically transparent regions 104. In the transparent display panel 100, the optically transparent regions 104 are defined by the driving electrode regions 102 and the circuit wiring regions 105. As described above, no first circuit wiring region 106 is provided between any two adjacent first direction strings 112 in the first direction D1, and no second circuit wiring region 108 is provided between two adjacent second direction strings 114 in the second direction D2. Under such a layout, the driving electrode regions 102 and the circuit wiring regions 106 may enclose plural optically transparent regions 104, and each of the optically transparent regions 104 may span among part of the driving electrode regions 102. That is, the optically transparent regions 104 span among the adjacent first direction strings 112 and span among the adjacent second direction strings 114. In this embodiment, each optically transparent region 104 is distributed approximately corresponding to the three pixel units 110 arranged in an L shape, so each optically transparent region 104 is approximately L-shaped. In addition, the area of each optically transparent region 104 is, for example, one to three times the area of each pixel unit 110.

In the transparent display panel 100, the average light transmittance of the driving electrode regions 102 and the circuit wiring regions 105 is less than ten percent, and the average light transmittance of the optically transparent regions 104 is greater than that of the driving electrode regions 102 and the circuit wiring regions 105. For instance, the average light transmittance of the optically transparent regions 104 ranges from ten percent to ninety-nine percent. Further, part of the first circuit wiring regions 106 are spaced apart by a first pitch PA1 in the second direction D2, another part of the first circuit wiring regions 106 are spaced apart by a second pitch PA2 in the second direction D2, and the first pitch PA1 is approximately twice the second pitch PA2. Similarly, part of the second circuit wiring regions 108 are spaced apart by a first pitch PB1 in the first direction D1, another part of the second circuit wiring regions 108 are spaced apart by a second pitch PB2 in the first direction D1, and the first pitch PB1 is approximately twice the second pitch PB2. Since some of the circuit wiring regions 105 are separated from the adjacent circuit wiring regions 105 by a relatively large distance, the optical diffraction caused by the dense and regular distribution of the circuit wiring regions 105 may be suppressed. Besides, the widely spaced circuit wiring regions 105 increase the width of a single optically transparent region 104, so that the transparent display panel 100 is allowed to exhibit sufficient light transmittance.

Other forms of transparent display panels are described below. In the following embodiments, elements identical or similar to those provided in the previous embodiments are represented by the same or similar reference numerals, description thereof is not to be repeated, and only the main differences are described.

Figure 2:
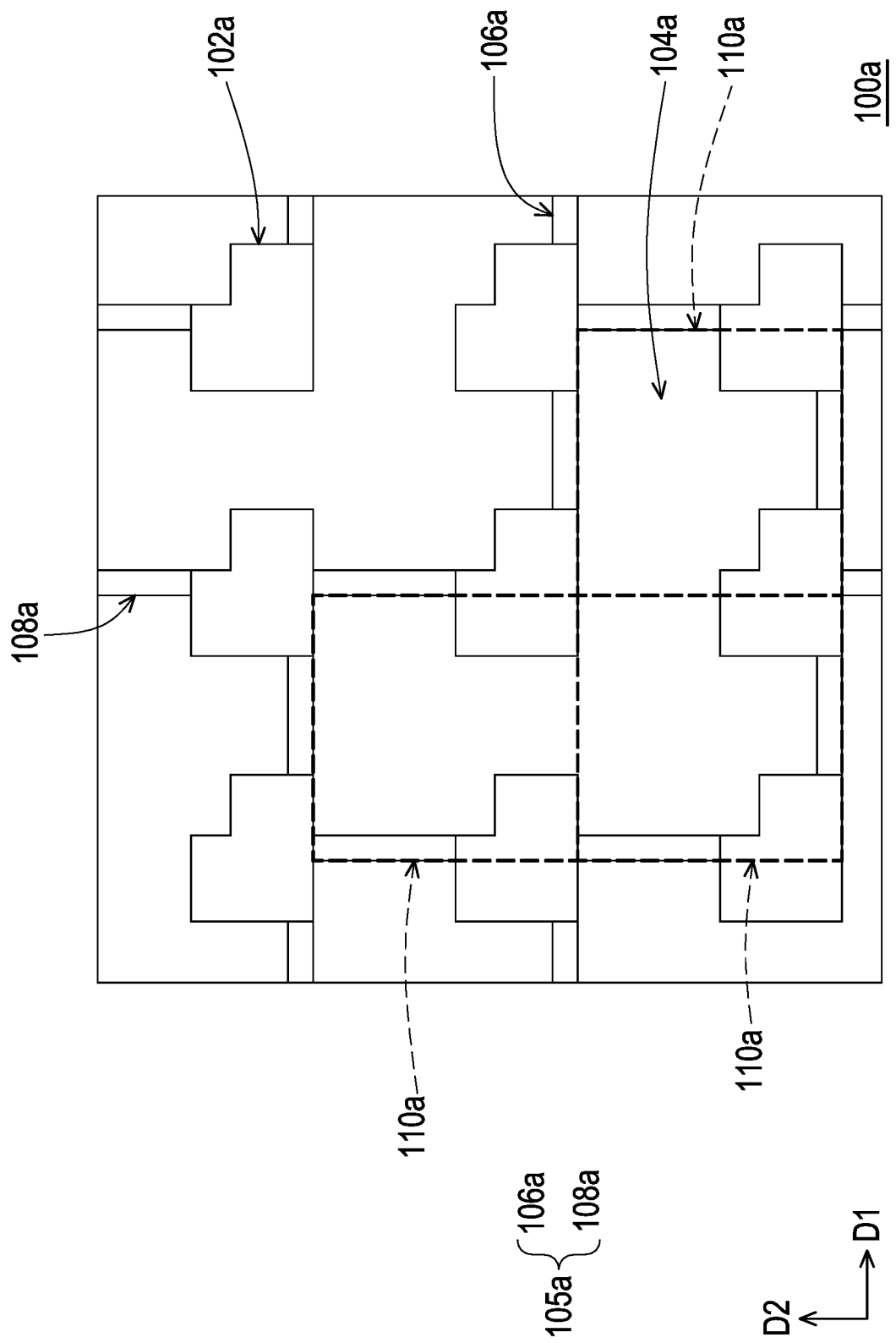
FIG. 2 is a top view of a transparent display panel according to an embodiment of the disclosure.

FIG. 2 is a top view of a transparent display panel 100a according to an embodiment of the disclosure. With reference to FIG. 2, the transparent display panel 100a includes a plurality of driving electrode regions 102a, a plurality of optically transparent regions 104a, and a plurality of circuit wiring regions 105a. The circuit wiring regions 105a extend among the driving electrode regions 102a, and the optically transparent regions 104a are enclosed by the driving electrode regions 102a and the circuit wiring regions 105a.

According to different extending directions, the circuit wiring regions 105a may be divided into first circuit wiring regions 106a and second circuit wiring regions 108a. As shown in FIG. 2, the shape of each driving electrode region 102a is approximately an L shape. It should be understood that the driving electrode regions 102 and 102a in FIG. 1 and FIG. 2 are only an example, rather than a limitation, of the driving electrode regions provided by the disclosure. In other embodiments, the shape of each driving electrode region 102a may be circular, trapezoidal, or any other geometric shape. The layout of the circuit wiring regions 105a in this embodiment is as described above, and the shape of each optically transparent region 104a in this embodiment is also approximately L-shaped.

In FIG. 2, the plural driving electrode regions 102a are arranged at equal intervals, that is, any adjacent driving electrode regions 102a have the same spacing in the first direction D1 or the second direction D2. In this way, a plurality of pixel units 110a may be defined by the arrangement of the driving electrode regions 102a. In this embodiment, each optically transparent region 104a corresponds to three pixel units 110a distributed along the L-shaped path, and the area of each optically transparent region 104a may be one to three times the area of each pixel unit 110a. Since some of the circuit wiring regions 105a are separated from the adjacent circuit wiring regions 105a by a relatively large distance, the optical diffraction caused by the dense distribution of the circuit wiring regions 105a may be suppressed. Besides, the widely spaced circuit wiring regions 105a increase the width of each optically transparent region 104a, so that the transparent display panel 100a is allowed to exhibit sufficient light transmittance.

Figure 3:
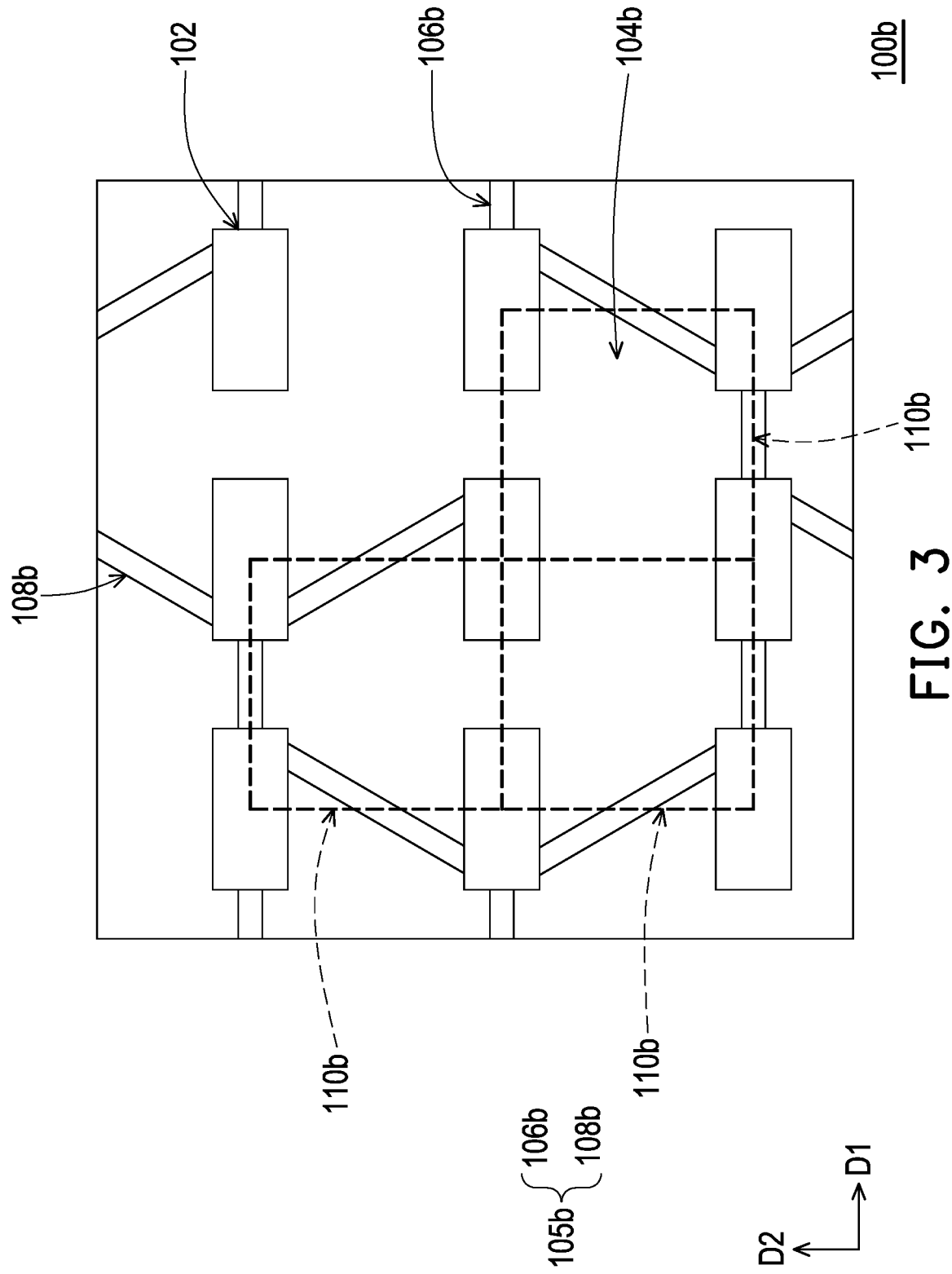
FIG. 3 is a top view of a transparent display panel according to an embodiment of the disclosure.

FIG. 3 is a top view of a transparent display panel 100b according to an embodiment of the disclosure. With reference to FIG. 3, the transparent display panel 100b includes a plurality of driving electrode regions 102, a plurality of optically transparent regions 104b, and a plurality of circuit wiring regions 105b. The transparent display panel 100b is substantially similar to the aforementioned transparent display panel 100, and the circuit wiring regions 105b provided by this embodiment may be divided into first circuit wiring regions 106b and second circuit wiring regions 108b. Each first circuit wiring region 106b connects the adjacent driving electrode regions 102 arranged in the first circuit wiring region D1, and each second circuit wiring region 108b connects the adjacent driving electrode regions 102 arranged in the second direction D2. The driving electrode regions 102 are arranged into an array at equal intervals, and a plurality of pixel units 110b may be defined. Each optically transparent region 104b may be distributed along three pixel units 110b (the three pixel units 110b as labeled in FIG. 3) arranged in an L-shaped path.

Different from the embodiment of FIG. 1, the extending direction of the first circuit wiring regions 106b is parallel to the first direction D1, and the extending direction of the second circuit wiring regions 108b is not parallel to the second direction D2. In the flat surface defined by the first direction D1 and the second direction D2, the second circuit wiring regions 108b may be treated as oblique lines, and the first circuit wiring regions 106b may be treated as straight lines. It should be understood that the extending direction of the circuit wiring regions 105b in this embodiment is only an example. That is, each circuit wiring region 105b may be a straight line, an oblique line, or a combination of the two. In this embodiment, the edge contour of each optically transparent region 104b may be a combination of straight lines and oblique lines according to the extended layout of the circuit wiring regions 105b and the shape of the driving electrode regions 102.

Figure 4:
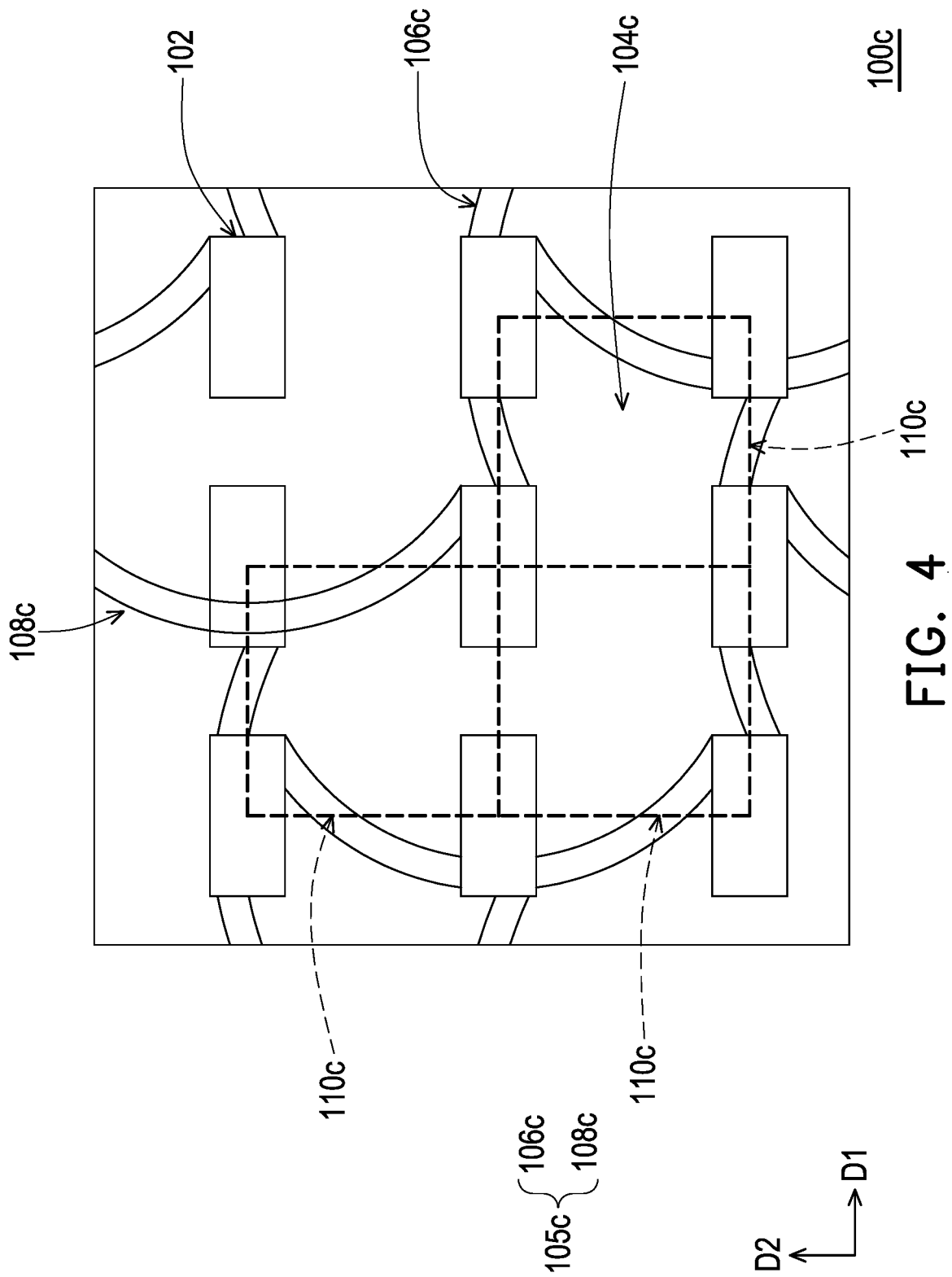
FIG. 4 is a top view of a transparent display panel according to an embodiment of the disclosure.

FIG. 4 is a top view of a transparent display panel 100c according to an embodiment of the disclosure. With reference to FIG. 4, the transparent display panel 100c includes a plurality of driving electrode regions 102, a plurality of optically transparent regions 104c, and a plurality of circuit wiring regions 105c. The driving electrode regions 102 are arranged into an array in the first direction D1 and the second direction D2 at equal intervals. Each circuit wiring region 105c extends between two adjacent driving electrode regions 102. The circuit wiring regions 105c may be divided into first circuit wiring regions 106c and second circuit wiring regions 108c according to the extending directions. The first circuit wiring regions 106c connect every three driving electrode regions 102 at intervals in the first direction D1, and the second circuit wiring regions 108c connect every three driving electrode regions 102 at intervals in the second direction D2. The driving electrode regions 102 are arranged into an array at equal intervals, and a plurality of pixel units 110c may be defined. Each optically transparent region 104c may be distributed along three pixel units 110c (the three pixel units 110c as labeled in FIG. 4) arranged in an L-shaped path.

Different from the embodiment of FIG. 1, the extending direction of the first circuit wiring regions 106c is not parallel to the first direction D1, and the extending direction of the second circuit wiring regions 108c is not parallel to the second direction D2 in this embodiment. In the flat surface defined by the first direction D1 and the second direction D2, the first circuit wiring regions 106c and the second circuit wiring regions 108c may be treated as arc-shaped wiring regions, and in some embodiments, each circuit wiring region 105c may be an arc-shaped region with different radians or arc lengths. In this embodiment, the edge contour of each optically transparent region 104c may be a combination of arc line segments and straight line segments in accordance with the contours of the circuit wiring regions 105c and the driving electrode regions 102.

Figure 5:
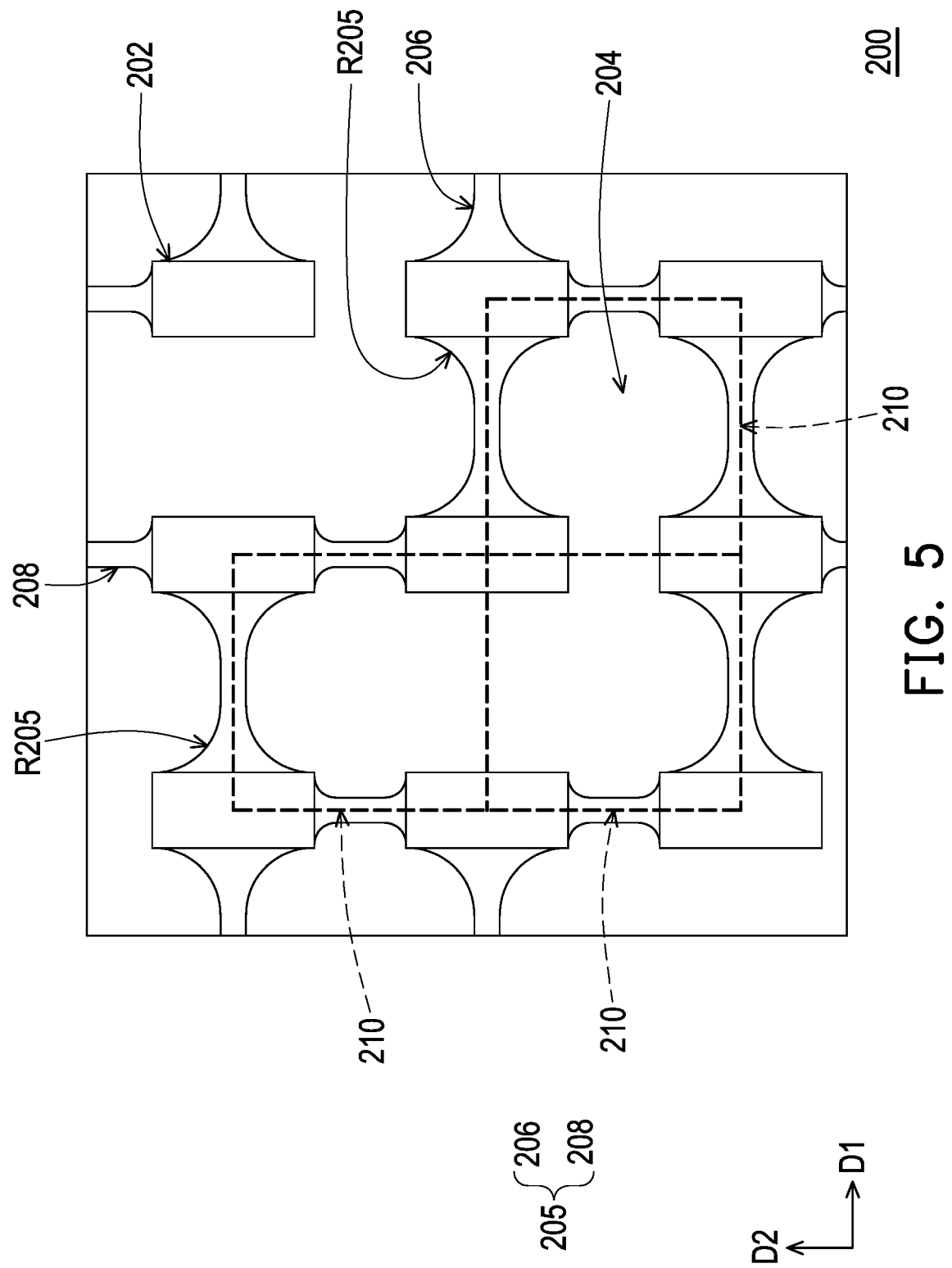
FIG. 5 is a top view of a transparent display panel according to an embodiment of the disclosure.

FIG. 5 is a top view of a transparent display panel 200 according to an embodiment of the disclosure. With reference to FIG. 5, the transparent display panel 200 includes a plurality of driving electrode regions 202, a plurality of optically transparent regions 204, and a plurality of circuit wiring regions 205. The driving electrode regions 202 are arranged into an array in the first direction D1 and the second direction D2 at equal intervals. Each circuit wiring region 205 extends between two adjacent driving electrode regions 202. In this embodiment, each driving electrode region 202 has a rectangular contour, and the width of each driving electrode region 202 in the first direction D1 is less than the length in the second direction D2. Besides, each circuit wiring region 205 has an arc-shaped contour 8205 at the intersection of the circuit wiring region 205 and the corresponding driving electrode region 202. For instance, the line width of each circuit wiring region 205 increases as it is closer to the driving electrode region 202.

The circuit wiring regions 205 may be divided into first circuit wiring regions 206 and second circuit wiring regions 208 according to the extending directions. The first circuit wiring regions 206 connect every three driving electrode regions 202 at intervals in the first direction D1, and the second circuit wiring regions 208 connect every three driving electrode regions 202 at intervals in the second direction D2. The driving electrode regions 202 are arranged into an array at equal intervals, and a plurality of pixel units 210 may be defined. Each optically transparent region 204 may be distributed along three pixel units 210 (the three pixel units 210 as labeled in FIG. 5) arranged in an L-shaped path.

Figure 6:
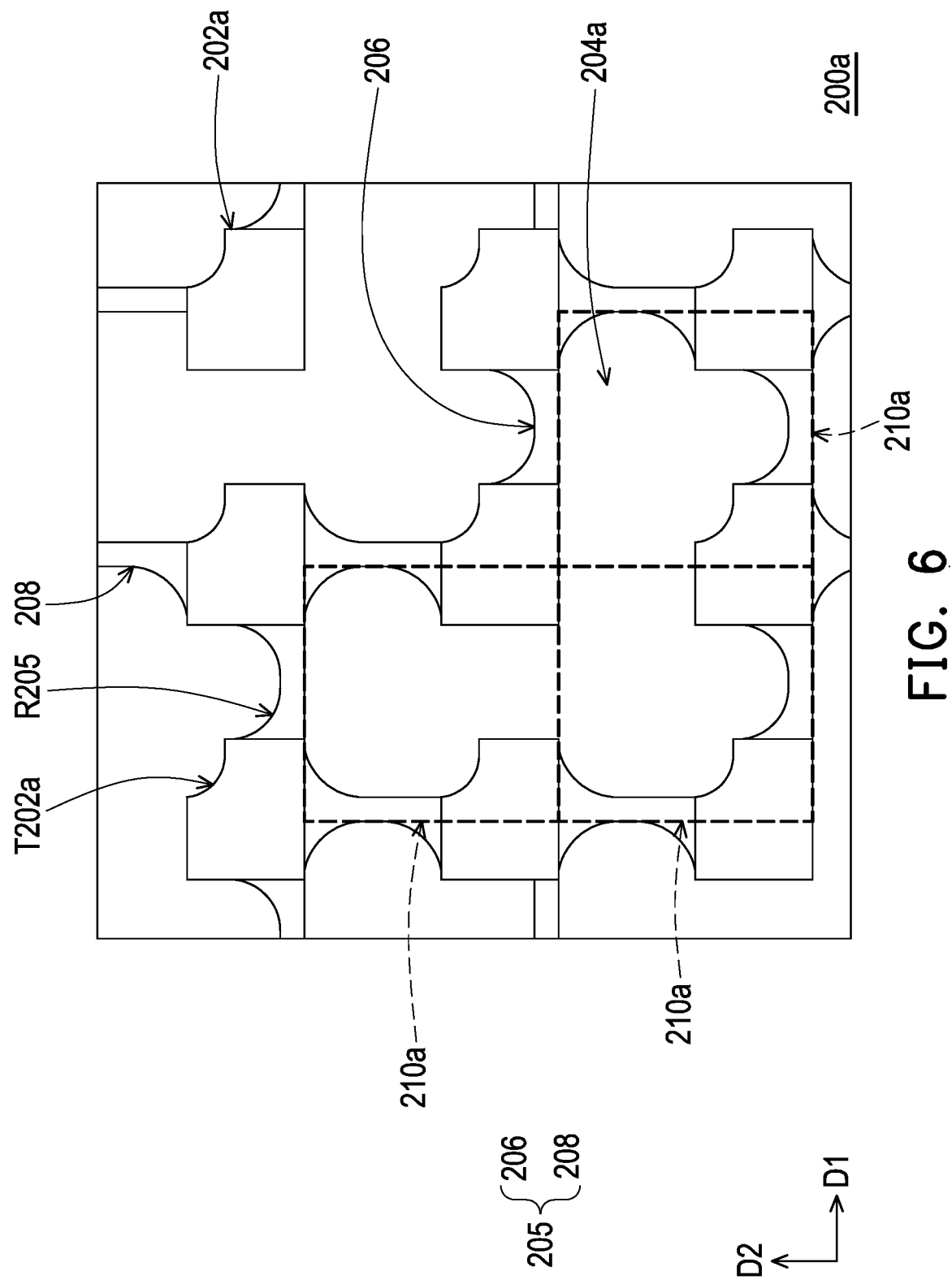
FIG. 6 is a top view of a transparent display panel according to an embodiment of the disclosure.

FIG. 6 is a top view of a transparent display panel 200a according to an embodiment of the disclosure. With reference to FIG. 6, the transparent display panel 200a includes a plurality of driving electrode regions 202a, a plurality of optically transparent regions 204a, and a plurality of circuit wiring regions 205. The layout of the circuit wiring regions 205 is substantially similar to that of the circuit wiring regions 205 in FIG. 5, so the same reference numeral is used herein. In this embodiment, the line width of each circuit wiring region 205 increases as it is closer to the driving electrode region 202a, so the circuit wiring region 205 has the arc-shaped outline R205. However, the contour of the driving electrode region 202a is different from that of the driving electrode region 202. Therefore, each optically transparent region 204a surrounded by the contours of the driving electrode regions 202a and the circuit wiring regions 205 also has a contour different from that of each optically transparent region 204. Further, each driving electrode region 202a has an L-shaped contour similar to that of the driving electrode region 102a of FIG. 2, but the contour of the driving electrode region 202a at a corner T202a is substantially arc-shaped. In the embodiments shown in FIG. 5 and FIG. 6, through the arc contour design of the arc-shaped contour R205 and the corner T202a, the area of each optically transparent region 204a may be partially sacrificed. However, the phenomenon that the image light is disturbed due to the optical diffraction at the contour edges of the circuit wiring regions 205 and the driving electrode regions 202a may be reduced. In this way, the blurring of the images of the transparent display panels 200 and 200a may be improved.

Figure 7:
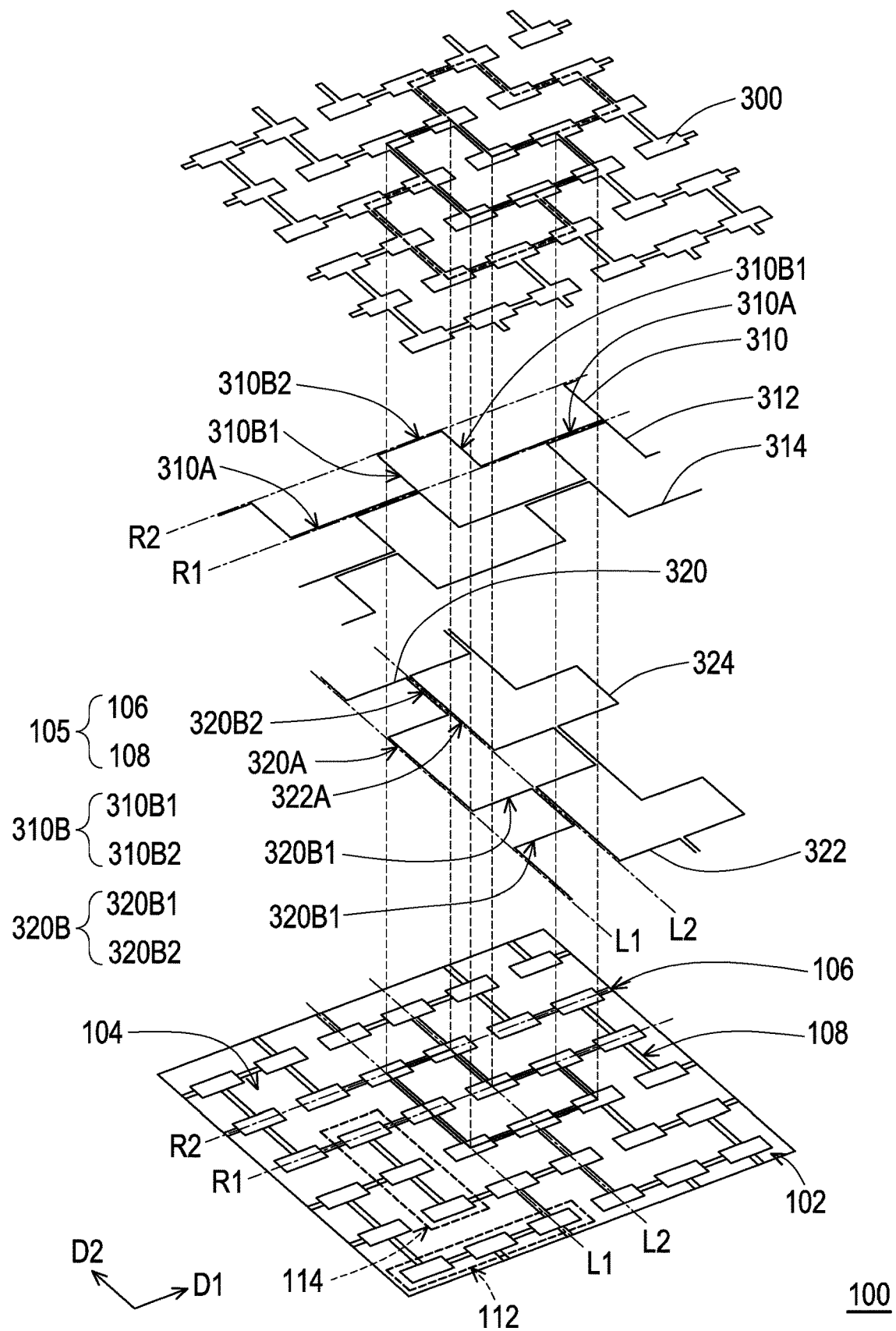
FIG. 7 is an exploded view of the transparent display panel according to an embodiment of the disclosure.

FIG. 7 is an exploded view of the transparent display panel 100 and part of the components thereof according to an embodiment of the disclosure. With reference to FIG. 7, the transparent display panel 100 includes the driving electrode regions 102, the optically transparent regions 104, and the circuit wiring regions 105, and description of the layout and arrangement of these regions may be found with reference to FIG. 1 and its related description. Part of the components of the transparent display panel 100 shown in FIG. 7 include a light-shielding layer 300, first signal lines 310, 312, and 314, and second signal lines 320, 322, and 324. The three first signal lines 310, 312, and 314 and the three second signal lines 320, 322, and 324 shown in FIG. 7 are only an example, and the number of the signal lines may increase or decrease according to the requirements of the transparent display panel 100.

The light-shielding layer 300 is generally distributed along the driving electrode regions 102 and the circuit wiring regions 105. In some embodiments, the light-shielding layer 300 may be made of light-shielding materials such as light-shielding resin and metal. In some embodiments, the light-shielding layer 300 is configured to cover the first signal lines 310, 312, and 314 and the second signal lines 320, 322, and 324 in the circuit wiring regions 105 and the gaps among these signal lines, so that the average light transmittance of the circuit wiring regions 105 is less than ten percent. Further, the light-shielding layer 300 may also be used to shield the components (e.g., driving circuit elements, light-emitting elements, etc.) provided in the circuit wiring regions 105. In FIG. 7, the contour of the light-shielding layer 300 is the combination of the driving electrode regions 102 and the circuit wiring regions 105. In other words, the distribution area of the light-shielding layer 300 defines the driving electrode regions 102 and the circuit wiring regions 105. In other embodiments, the contour of the light-shielding layer 300 may selectively only correspond to the contour of the circuit wiring regions 105 of the transparent display panel 100. The light-shielding layer 300 may be applied to the transparent display panels 200 and 200a shown in FIG. 5 and FIG. 6. Further, in FIG. 5 and FIG. 6, the arc-shaped contours R205 at the intersections of the circuit wiring regions 205 and 205a and the driving electrode regions 202 and 202a and the arc-shaped contours of the driving electrode regions 202a at the corners T202a may be defined by the light-shielding layer 300.

The first signal lines 310, 312, and 314 and the second signal lines 320, 322, and 324 are configured to connect the driving electrodes and/or driving circuit elements disposed in the driving electrode regions 102 and are configured to transmit electrical signals. The first signal lines 310, 312, and 314 and the second signal lines 320, 322, and 324 extend along the circuit wiring regions 105. Further, to be specific, each of the circuit wiring regions 105 is provided with at least one of the first signal line 310, 312, and 314 and at least one of the second signal lines 320, 322, and 324. The first signal lines 310, 312, and 314 and the second signal lines 320, 322, and 324 may be formed by at least two conductive layers, and the first signal lines 310, 312, and 314 and the second signal lines 320, 322, and 324 are electrically independent from each other. In this embodiment, the first signal lines 310, 312, and 314 are used for transmitting signals in the first direction D1, and the second signal lines 320, 322, and 324 are used for transmitting signals in the second direction D2.

The first signal lines 310, 312, 314 and the second signal lines 320, 322, and 324 are all non-linear wiring lines, and each signal line may include a plurality of series-connected segments and a plurality of meandering segments. For instance, the first signal line 310 includes series-connected segments 310A and meandering segments 310B, and the first signal line 310 is used for transmitting electrical signals in a row R1, for example. In the first signal line 310, each series-connected segment 310A extends along the corresponding first direction string 112 in the row R1 and continuously passes through the three driving electrode regions 102 in the first direction string 112, and each meandering segment 310B is connected between two series-connected segments 310A, and the meandering segment 310B meanders between the first direction string 112 in the row R1 and the first direction string 112 in a row R2. Similarly, the second signal line 320 includes series-connected segments 320A and meandering segments 320B, and the second signal line 320 is used for transmitting electrical signals in a column L1. In the second signal line 320, each series-connected segment 320A extends along the corresponding second direction string 114 in the column L1 and continuously passes through the three driving electrode regions 102 in the second direction string 114, and each meandering segment 320B is connected between two series-connected segments 320A, and the meandering segment 320B meanders between the second direction string 114 in the column L1 and the second direction string 114 in a column L2. The row R1 and the row R2 are adjacent rows and the column L1 and the column L2 are adjacent columns.

With reference to FIG. 7, in the first signal line 310, all the series-connected segments 310A of the first signal line 310 extend along the first direction strings 112 arranged on the same row R1. However, the first direction strings 112 on the same row R1 are spaced apart from each other. In order to form a continuous line, the meandering segments 310B are provided between adjacent series-connected segments 310A. Each of the meandering segments 310B includes two first sub-segments 310B1 and one second sub-segment 310B2. The extending direction of the first sub-segments 310B1 is different from that of the series-connected segments 310A, and the extending direction of the second sub-segment 310B2 may be the same as that of the series-connected segments 310A, but it is not limited thereto.

To be specific, one of the first sub-segments 310B1 of the meandering segment 310B extends from the driving electrode region 102 at the edge of the first direction string 112 of the row R1 along the corresponding second circuit wiring region 108 to the driving electrode region 102 in the middle of the first direction string 112 of the adjacent row R2. The second sub-segment 310B2 of the meandering segment 310B extends from the end of the first sub-segment 310B1 along the first direction string 112 of the adjacent row R2 to the driving electrode region 102 of the edge. The other first sub-segment 310B1 of the meandering segment 310B extends from the driving electrode region 102 at the edge of the first direction string 112 of the adjacent row R2 to the first direction string 112 of the row R1 along the corresponding second circuit wiring region 108 and is connected to another series-connected segment 310A in another first direction string 112.

The above is the connection between one series-connected segment 310A and one meandering segment 310B in the first signal line 310, and according to the above connection manner, the plurality of series-connected segments 310A and the plurality of meandering segments 310B are connected to form the continuous first signal line 310. In view of the above, each series-connected segment 310A extends along the first directional string 112 of the corresponding row R1, and the second sub-segment 310B2 of each meandering segment 310B extends along the first direction string 112 of the adjacent row R2. One end of the second sub-segment 310B2 is connected to the end of the series-connected segment 310A through the first sub-segment 310B1, and the other end of the second sub-segment 310B2 is connected to the end of the another series-connected segment 310A of the row R1 through the other first sub-segment 310B1. In addition, the meandering segments (with reference to the meandering segment 310B of the first signal line 310) of the first signal lines 310, 312, and 314 may be arranged in an oblique direction, that is, the meandering segments of the adjacent signal lines are staggered from each other in the first direction D1 and are not arranged in parallel in the second direction D2.

With reference to FIG. 7 again, in the second signal line 320, all the series-connected segments 320A of the second signal line 320 extend along the second direction strings 114 arranged on the same column L1. The second direction strings 114 in the same column L1 are spaced apart from one another. In order to form a continuous line, the meandering segments 320A are provided between adjacent series-connected segments 320B. Each of the meandering segments 320B includes two first sub-segments 320B1 and one second sub-segment 320B2. The extending direction of the first sub-segments 320B1 is different from that of the second sub-segment 320B2, and the extending direction of the second sub-segment 320B2 may be the same as that of the series-connected segments 320A. One of the first sub-segments 320B1 of the meandering segment 320B extends from the driving electrode region 102 at the edge of the second direction string 114 of the column L1 along the corresponding first circuit wiring region 106 to the driving electrode region 102 in the middle of the second direction string 114 of the adjacent column L1. The second sub-segment 320B2 of the meandering segment 320B extends along the second direction string 114 of the adjacent column L2 to the driving electrode region 102 of the edge of the second direction string 114 of the column L2 to connect the two first sub-segments 320B1. The other first sub-segment 320B1 of the meandering segment 320B extends from the driving electrode region 102 at the edge of the second direction string 114 of the column L2 to the column L1 along the corresponding first circuit wiring region 106 and is connected to another series-connected segment 320A in another second direction string 114.

The above is the connection between one series-connected segment 320A and one meandering segment 320B in the second signal line 320, and according to the above connection manner, the plurality of series-connected segments 320A and the plurality of meandering segments 320B are connected to form one second signal line 320. In view of the above, each series-connected segment 320A extends along the second directional string 114 of the corresponding column L1, and the second sub-segment 320B2 of each meandering segment 320B extends along the second direction string 114 of the adjacent column L2. One end of the second sub-segment 320B2 is connected to the end of another series-connected segment 310A of the column L1 through the first sub-segment 320B1. In addition, the meandering segments (with reference to the meandering segment 320B of the second signal line 320) of the second signal lines 320, 322, and 324 may be arranged in an oblique direction, that is, the meandering segments of the adjacent signal lines are staggered from each other in the second direction D2 and are not arranged in parallel in the first direction D1.

The series-connected segments 310A and 320A of the first signal line 310 and the second signal line 320 are electrically connected through the meandering segments 310B and 320B, such that the first signal line 310 and the second signal line 320 are not limited to extend in the same row or the same column. Under such a layout, each of the circuit wiring regions 105 is provided with at least one of the first signal lines 310 and at least one of the second signal lines 320. For instance, regarding the second circuit wiring region 108 arranged in one of the first sub-segments 310B1 in FIG. 7, in addition to being provided with one first sub-segment 310B1, this second circuit wiring region 108 may also be provided with one of the second sub-segments 320B2 of the second signal line 320 may further be provided with one of extended segments 322A of the second signal line 322. Besides, the signal lines disposed in each circuit wiring region 105 may be single-layered side-by-side lines, multi-layered stacked lines, or a combination of the foregoing.

Figure 8:
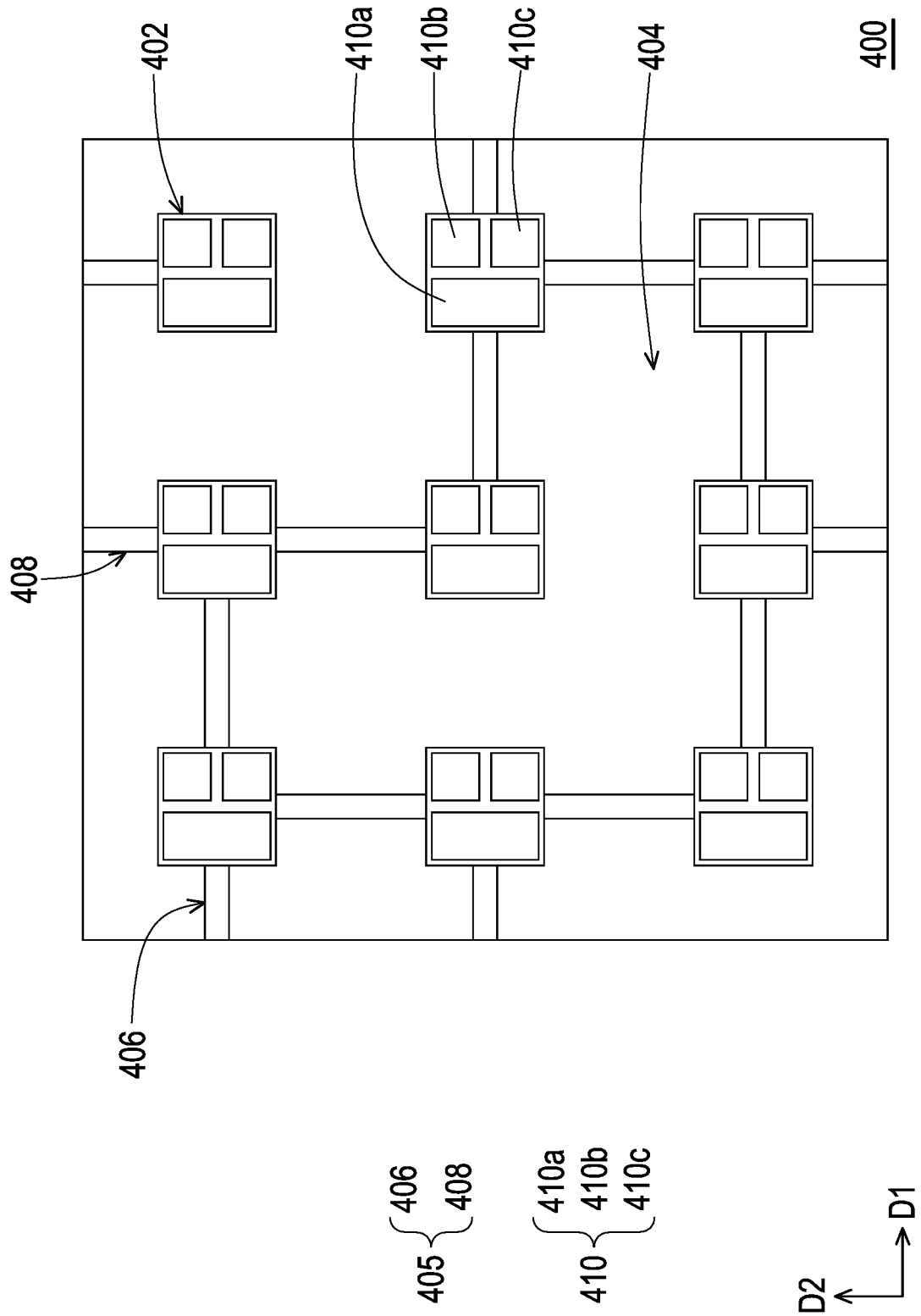
FIG. 8 is a top view of a transparent display panel using organic light-emitting diodes as display elements according to an embodiment of the disclosure.

FIG. 8 is a top view of a transparent display panel 400 using organic light-emitting diodes 410 as display elements according to an embodiment of the disclosure. The transparent display panel 400 includes a plurality of driving electrode regions 402, a plurality of optically transparent regions 404, and a plurality of circuit wiring regions 405. The circuit wiring regions 405 may be divided into first circuit wiring regions 406 and second circuit wiring regions 408 according to different extending directions. Similar to the layout of the transparent display panel 100, the driving electrode regions 402 are arranged into an array in the first direction D1 and the second direction D2. The first circuit wiring regions 406 connect the driving electrode regions 402 at intervals in the first direction D1, and the second circuit wiring regions 408 connect the driving electrode regions 402 at intervals in the second direction D2. To be specific, the first circuit wiring regions 406 connect every three driving electrode regions 402 arranged in the first direction D1 into a string, and the second circuit wiring region 408 connects every three driving electrode regions 402 arranged in the second direction D2 into a string.

The transparent display panel 400 includes the organic light-emitting diodes 410, and the organic light-emitting diodes 410 are display elements for displaying picture information. In this embodiment, each driving electrode region 402 is provided with three organic light-emitting diodes 410 to define a sub-pixel 410a, a sub-pixel 410b, and a sub-pixel 410c. For instance, the sub-pixel 410a is a blue sub-pixel, the sub-pixel 410b is a green sub-pixel, and the sub-pixel 410c is a red sub-pixel. The light-emitting areas of the sub-pixel 410a, the sub-pixel 410b, and the sub-pixel 410c may be adjusted according to the required light-emitting effect. For instance, the blue sub-pixel 410a may have a larger light-emitting area than the sub-pixel 410b and the sub-pixel 410c, but it is not limited thereto. In this embodiment, the sub-pixel 410b and the sub-pixel 410c are arranged in the second direction D2 and are located on the same side of the sub-pixel 410a, but the arrangement and number of the sub-pixels 410a, 410b, and 410c are not limited to this embodiment.

The organic light-emitting diodes 410 have self-luminous properties without requiring an additional light source, and the transparent display panel 400 may further include a plurality of signal lines (not shown) to provide the organic light-emitting diodes 410 with electrical signals required for light emission. The signal lines for providing electrical signals may extend along the first circuit wiring regions 406 and the second circuit wiring regions 408. For instance, the distribution of the first signal lines 310, 312, and 314 and the second signal lines 320, 322, and 324 in FIG. 7 may be applied in this embodiment to provide the signals required by the organic light-emitting diodes 410. Besides, the transparent display panel 400 may further include a light-shielding layer as shown in FIG. 7.

Figure 9:
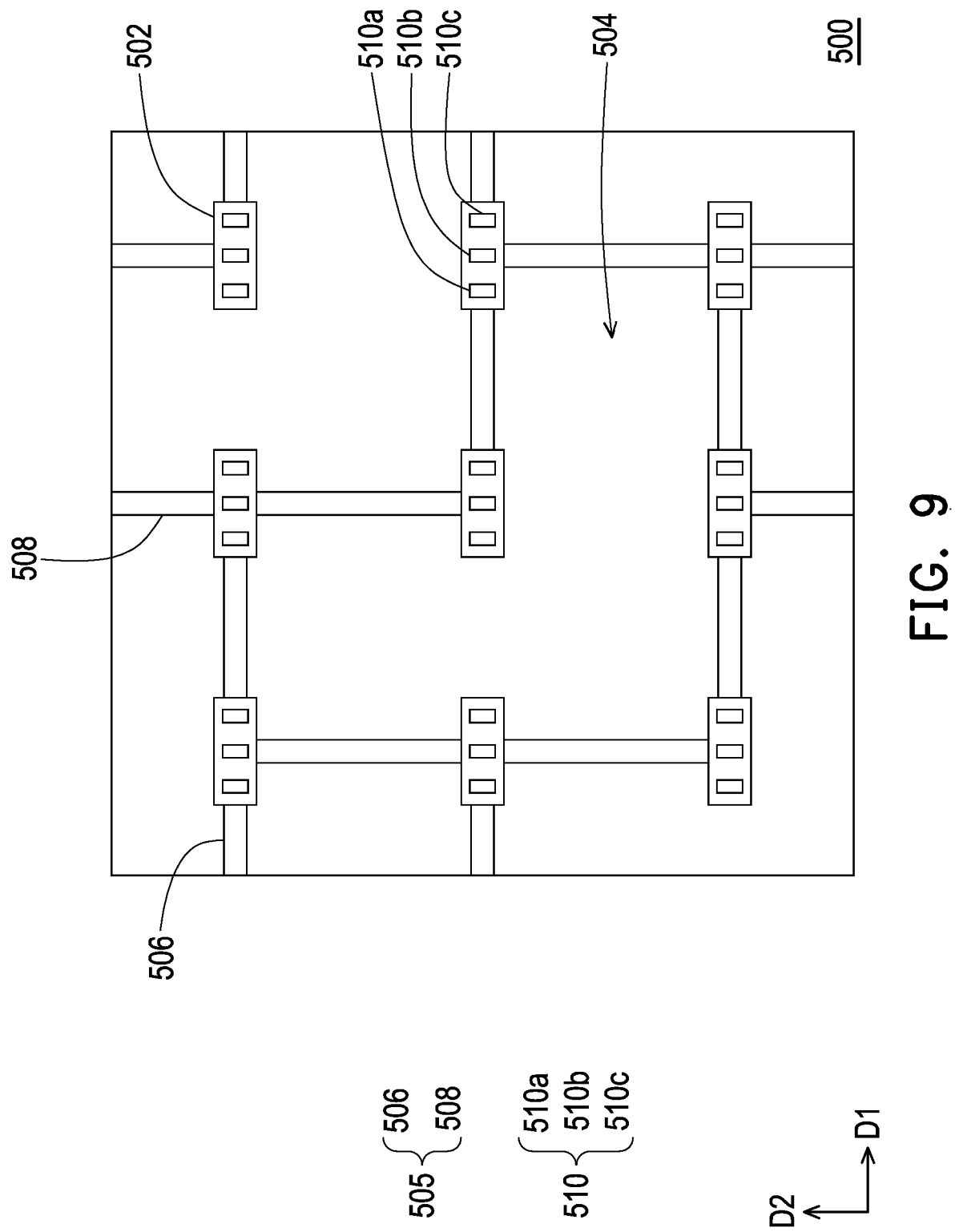
FIG. 9 is a top view of a transparent display panel using micro light-emitting diodes as display elements according to an embodiment of the disclosure.

FIG. 9 is a top view of a transparent display panel 500 using micro light-emitting diodes 510 as display elements according to an embodiment of the disclosure. The transparent display panel 500 includes a plurality of driving electrode regions 502, a plurality of optically transparent regions 504, and a plurality of circuit wiring regions 505. The circuit wiring regions 505 may be divided into first circuit wiring regions 506 and second circuit wiring regions 508 according to different extending directions. Similar to the layout of the transparent display panel 100, the driving electrode regions 502 are arranged into an array in the first direction D1 and the second direction D2. The first circuit wiring regions 506 connect every three driving electrode regions 502 at intervals in the first direction D1, and the second circuit wiring regions 508 connect every three driving electrode regions 502 at intervals in the second direction D2. To be specific, the first circuit wiring regions 506 connect every three driving electrode regions 502 arranged in the first direction D1 into a string, and the second circuit wiring region 508 connects every three driving electrode regions 502 arranged in the second direction D2 into a string.

The transparent display panel 500 includes the micro light-emitting diodes 510, and the micro light-emitting diodes 510 are display elements for displaying picture information. Each driving electrode region 502 is provided with three micro light-emitting diodes 510 to define a sub-pixel 510a, a sub-pixel 510b, and a sub-pixel 510c exhibiting different colors. The sub-pixel 510a, the sub-pixel 510b, and the sub-pixel 510c may be arranged in the first direction D1 but may also be arranged in different ways depending on different designs. The micro light-emitting diodes 510 have self-luminous properties without requiring an additional light source, and the transparent display panel 500 may also include a plurality of signal lines (not shown) to provide the micro light-emitting diodes 502 with electrical signals required for light emission. The signal lines for providing electrical signals may extend along the first circuit wiring regions 506 and the second circuit wiring regions 508. For instance, the distribution of the signal lines in FIG. 7 may be applied in this embodiment to provide the signals required by the micro light-emitting diodes 502. Besides, the transparent display panel 500 may further include a light-shielding layer as shown in FIG. 7.

Figure 10:
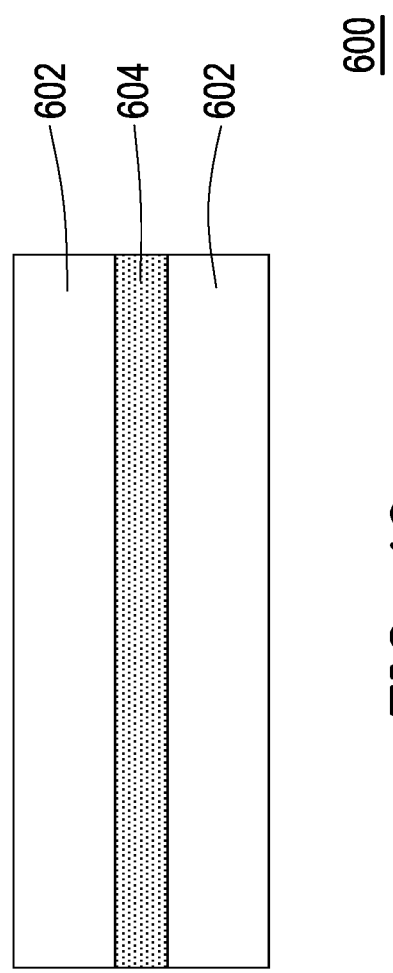
FIG. 10 is a schematic view of a transparent display panel using a liquid crystal material as a display element according to an embodiment of the disclosure.

FIG. 10 is a schematic view of a transparent display panel 600 using a liquid crystal material as a display element. The transparent display panel 600 of FIG. 10 includes two substrates 602 and a liquid crystal layer 604, and the liquid crystal layer 604 is enclosed between the two substrates 602. In some embodiments, the transparent display panel 600 may further include polarizers, alignment films, and other elements. Besides, the transparent display panel 600 may be provided with a light-shielding layer (not shown) on one of the two substrates 602. The transparent display panel 600 is described in detail below.

Figure 11:
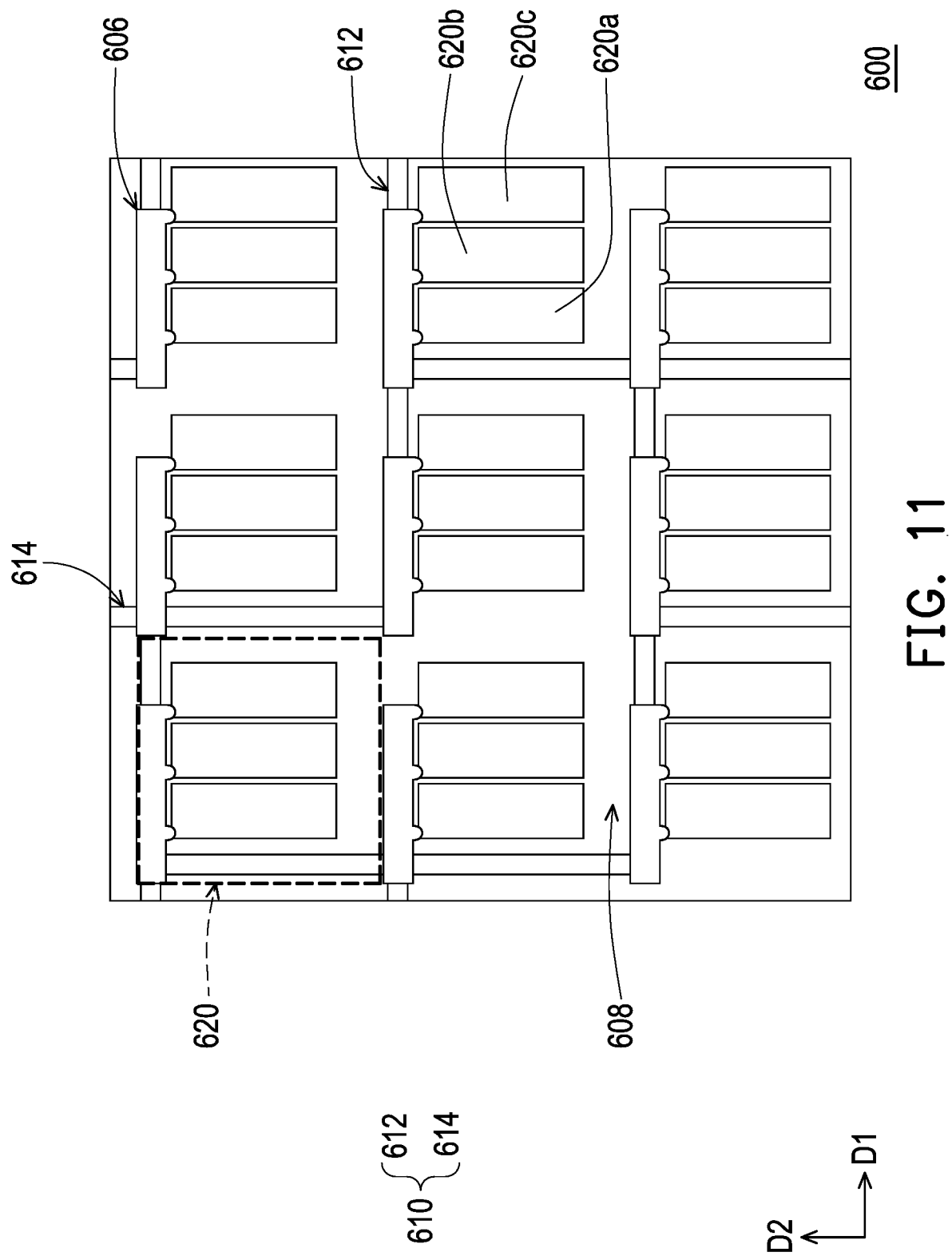
FIG. 11 is a top view of the transparent display panel using a liquid crystal layer according to an embodiment of the disclosure.

FIG. 11 is a top view of the transparent display panel 600 using a liquid crystal layer. The transparent display panel 600 may include a plurality of driving electrode regions 606, a plurality of optically transparent regions 608, and a plurality of circuit wiring regions 610. The circuit wiring regions 610 may be divided into first circuit wiring regions 612 and second circuit wiring regions 614 according to different extending directions. The circuit wiring regions 610 may connect every three driving electrode regions 606 at intervals in the first direction D1 and the second direction D2 to enclose the optically transparent regions 608 each having a substantially L-shaped contour. Similar to the aforementioned transparent display panel, the driving electrode regions 606 may be arranged into an array in the first direction D1 and the second direction D2 to define a plurality of pixel units 620. The circuit wiring regions 610 connect the driving electrode regions 606 at intervals, and the optically transparent regions 608 are surrounded by the driving electrode regions 606 and the circuit wiring regions 610.

Each pixel unit 620 of the transparent display panel 600 includes a driving element (not shown), such as a thin film transistor, arranged in the driving electrode region 606, and a sub-pixel electrode 620a, a sub-pixel electrode 620b, and a sub-pixel electrode 620c arranged in the optically transparent region 608. To be specific, the driving element in each driving electrode region 606 may be connected to the sub-pixel electrode 620a, the sub-pixel electrode 620b, and the sub-pixel electrode 620c correspondingly. In addition, the transparent display panel 600 may further include a plurality of signal lines (not shown) to transmit electrical signals required by the driving elements. The signal lines for providing electrical signals may extend along the first circuit wiring regions 612 and the second circuit wiring regions 614. For instance, the distribution of the signal lines in FIG. 7 may be applied in this embodiment to provide the signals required by the driving elements. Besides, the transparent display panel 600 may further include a light-shielding layer as shown in FIG. 7.

In view of the foregoing, disclosure aims to improve the problem of image blurring caused by the dense distribution of wires in the conventional transparent display panel. In the embodiments of the disclosure, the distribution of the circuit wiring regions is modified, so that the obvious diffraction caused by multiple wires in the transparent display panel is reduced, and the area of the optically transparent regions is increased. In this way, the imaging quality of the transparent display panel is improved, and the transparent display panel maintains a certain degree of transparency.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A transparent display panel, comprising:
a plurality of driving electrode regions arranged into an array in a first direction and a second direction;
a plurality of circuit wiring regions with an average light transmittance less than ten percent, wherein the circuit wiring regions comprises first circuit wiring regions, each of the first circuit wiring regions connecting two of the driving electrode regions arranged in the first direction, and the first circuit driving regions being arranged at a first pitch and a second pitch alternately along the first direction, wherein the first pitch is different from the second pitch; and
a plurality of optically transparent regions with an average light transmittance greater than that of the driving electrode regions and the circuit wiring regions,
wherein the first direction and the second direction intersect, and the circuit wiring regions connect the driving electrode regions at intervals, such that each of the optically transparent regions spans among part of the driving electrode regions,
wherein the transparent display panel comprises a plurality of first signal lines and a plurality of second signal lines,
wherein the first signal lines and the second signal lines extend along the circuit wiring regions, and each of the circuit wiring regions is provided with at least one of the first signal lines and at least one of the second signal lines.

2. The transparent display panel according to claim 1, wherein the driving electrode regions are equally spaced to define a plurality of pixel units, and an area of each of the optically transparent regions is one to three times an area of each of the pixel units.

3. The transparent display panel according to claim 1, wherein the
first circuit wiring regions connect every three driving electrode regions at intervals in the first direction to form a plurality of first direction strings, wherein the adjacent first direction strings in the first direction are spaced apart from each other; and
the circuit wiring regions further comprises a plurality of second circuit wiring regions, connecting every three driving electrode regions at intervals in the second direction to form a plurality of second direction strings, wherein the adjacent second direction strings in the second direction are spaced apart from each other.

4. The transparent display panel according to claim 3, wherein the optically transparent regions span among the adjacent first direction strings and span among the adjacent second direction strings.

5. The transparent display panel according to claim 3, wherein the middle driving electrode region among the three driving electrode regions in each first direction string is the edge driving electrode region among the three driving electrode regions in one of the second direction strings.

6. The transparent display panel according to claim 3, wherein the middle driving electrode region among the three driving electrode regions in each second direction string is the edge driving electrode region among the three driving electrode regions in one of the first direction strings.

7. The transparent display panel according to claim 3, wherein an extending direction of the first circuit wiring regions is not parallel to the first direction.

8. The transparent display panel according to claim 3, wherein an extending direction of the second circuit wiring regions is not parallel to the second direction.

9. The transparent display panel according to claim 3, wherein each of the first signal lines comprises a plurality of series-connected segments and a plurality of meandering segments, each of the series-connected segments extends along the corresponding first direction string, the meandering segments are connected between the series-connected segments, and the meandering segments meander between the corresponding first direction strings and the adjacent first direction strings.

10. The transparent display panel according to claim 9, wherein each of the meandering segments comprises two first sub-segments and one second sub-segment, the two first sub-segments extend from the corresponding first direction strings to the adjacent first direction strings along the corresponding second direction strings, and the second sub-segment extends along the adjacent first direction string, and the second sub-segment is connected between the two first sub-segments.

11. The transparent display panel according to claim 3, wherein each of the second signal lines comprises a plurality of series-connected segments and a plurality of meandering segments, each of the series-connected segments extends along the corresponding second direction string, the meandering segments are connected between the series-connected segments, and the meandering segments meander between the corresponding second direction strings and the adjacent second direction strings.

12. The transparent display panel according to claim 11, wherein each of the meandering segments comprises two first sub-segments and one second sub-segment, the two first sub-segments extend from the corresponding second direction strings to the adjacent second direction strings along the corresponding first direction strings, the second sub-segment extends along the adjacent second direction string, and the second sub-segment is connected between the two first sub-segments.

13. The transparent display panel according to claim 1, further comprising: a light-shielding layer completely covering the circuit wiring regions.

14. The transparent display panel according to claim 13, wherein the light-shielding layer has arc-shaped contours at intersections of the circuit wiring regions and the driving electrode regions.

15. The transparent display panel according to claim 1, wherein the first signal lines and the second signal lines are formed by at least two conductive layers, and the first signal lines and the second signal lines are electrically independent from each other.

16. A transparent display panel, comprising:
a plurality of driving electrode regions arranged into an array in a first direction and a second direction;

a plurality of circuit wiring regions with an average light transmittance less than ten percent, wherein the circuit wiring regions connect every three driving electrode regions at intervals in the first direction to form a plurality of first direction strings; and a plurality of optically transparent regions with an average light transmittance greater than that of the driving electrode regions and the circuit wiring regions, wherein the first direction and the second direction intersect, and the circuit wiring regions connect the driving electrode regions at intervals, such that each of the optically transparent regions spans among part of the driving electrode regions, wherein the transparent display panel comprises a plurality of first signal lines and a plurality of second signal lines, wherein the first signal lines and the second signal lines extend along the circuit wiring regions, and each of the circuit wiring regions is provided with at least one of the first signal lines and at least one of the second signal lines, and each of the first signal lines comprises a plurality of series-connected segments and a plurality of meandering segments, each of the meandering segments comprises two first sub-segments and one second sub-segment, the two first sub-segments extend from the corresponding first direction strings to the adjacent first direction strings along the corresponding second direction strings, and the second sub-segment extends along the adjacent first direction string, and the second sub-segment is connected between the two first sub-segments.

17. A transparent display panel, comprising:

a plurality of driving electrode regions arranged into an array in a first direction and a second direction;

a plurality of circuit wiring regions with an average light transmittance less than ten percent;

a plurality of optically transparent regions with an average light transmittance greater than that of the driving electrode regions and the circuit wiring regions; and a light-shielding layer completely covering the circuit wiring regions, wherein the light-shielding layer has arc-shaped contours at intersections of the circuit wiring regions and the driving electrode regions, wherein the first direction and the second direction intersect, and the circuit wiring regions connect the driving electrode regions at intervals, such that each of the optically transparent regions spans among part of the driving electrode regions, wherein the transparent display panel comprises a plurality of first signal lines and a plurality of second signal lines, wherein the first signal lines and the second signal lines extend along the circuit wiring regions, and each of the circuit wiring regions is provided with at least one of the first signal lines and at least one of the second signal lines.

* * * * *